United States Patent [19]

Zumsteg

[11] 4,076,987
[45] Feb. 28, 1978

[54] MULTIPLE RESONATOR OR FILTER VIBRATING IN A COUPLED MODE

[75] Inventor: Alphonse E. Zumsteg, Solothurn, Switzerland

[73] Assignee: Societe Suisse pour l'Industrie Horlogere Management Services S.A., Bienne, Switzerland

[21] Appl. No.: 749,559

[22] Filed: Dec. 10, 1976

[51] Int. Cl.² .................................. H01L 41/04
[52] U.S. Cl. .......................................... 310/361
[58] Field of Search ............... 310/8.2, 9.5, 9.6, 9.8; 333/72

[56] References Cited

U.S. PATENT DOCUMENTS

| | | |
|---|---|---|
| 2,306,909 | 12/1942 | Sykes ................................. 310/9.5 |
| 3,222,622 | 12/1965 | Curran et al. ..................... 310/9.8 X |
| 3,525,944 | 8/1970 | Smith ................................. 310/9.8 X |
| 3,564,463 | 2/1971 | Beaver et al. ..................... 310/9.8 X |
| 3,614,483 | 10/1971 | Berlincourt ....................... 310/8.2 X |
| 3,704,433 | 11/1972 | Garrison ............................ 310/9.8 X |

Primary Examiner—Mark O. Budd
Attorney, Agent, or Firm—Griffin, Branigan and Butler

[57] ABSTRACT

A multiple resonator or filter is described in the form of a rectangular bar of piezoelectric material having dimensional ratios selected so as to assure vibration in a thickness shear mode strongly coupled with a flexural mode. At least two energy trapping zones are provided extending over the entire width of the bar. The arrangement enables achievement of a high quality factor combined with extremely small dimensions.

10 Claims, 20 Drawing Figures

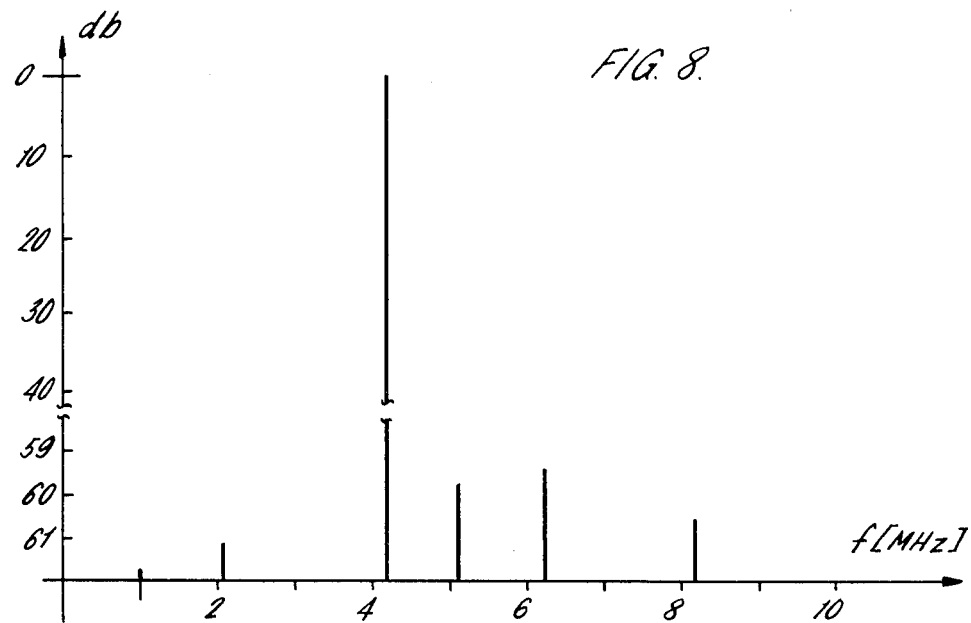
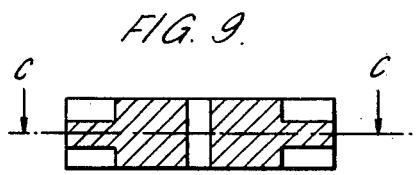
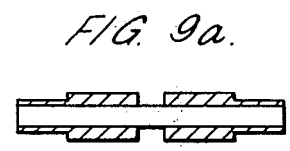
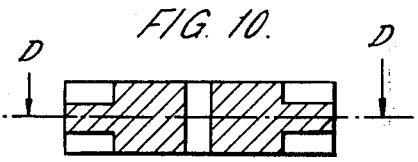
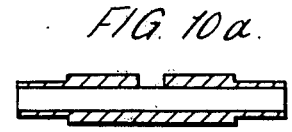
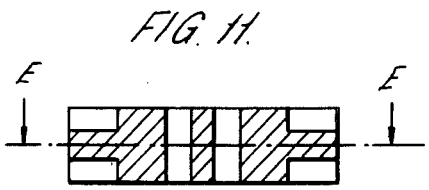
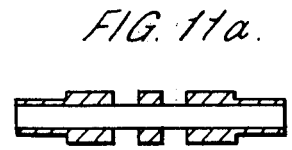

MULTIPLE RESONATOR OR FILTER VIBRATING IN A COUPLED MODE

BACKGROUND OF THE INVENTION

The invention to be described hereinafter is closely related to an invention made by the present inventor in collaboration with Messrs. J.ENGDAHL and R. HUGUENIN and set forth in patent application ser. no. 650,643 (OM 355). In the earlier application there was given a solution to the problem of providing a high frequency high precision quartz resonator suitable for use in time keeping instruments such as wrist watches. The solution proposed was contrary to all known solutions for the provision of high frequency quartz resonators and indeed solutions which have been used over the past 35 years. In so proposing these solutions the inventors of the prior application made use of what may be referred to as coupled vibration modes.

The present invention seeks to extend the teachings set forth in the earlier filed application to multiple resonators or filters.

The utilization of a bar of quartz or other piezoelectric materials having thereon several energy trapping zones in order to obtain filter action is well known. The following publications give certain theoretic aspects and practical realizations of such filters:

1. M.Onoe and H.Jumonji Analysis of piezoelectric resonators vibrating in trapped energy modes., Electr. & Comm. Eng. Japon Vol. 48, pg. 84(1965)
2. R.A.Sykes, W.L.Smith and W.J.Spencer Monolithic crystal filters, IEEE Intern. Convention Record, part. III, pg. 78,(1967)
3. H.Mailer and D.R.Beuerle Incorporation of multiresonator crystals into filters for quantity production Proc 20th annual Symposium on frequency control, pg. 309(1966)

These publications in each case analyse a situation in which thickness shear vibrations occur and wherein the electrodes occupy only a small portion of the surface of the piezoelectric bar or plate. Such a restriction is required in view of the following phenomena:

1. In a thin plate of finite dimensions a thickness shear mode is always coupled to a flexure mode which propagates in the same direction as that of the displacement of material particles due to the thickness shear vibrations. For example in a quartz bar or plate in the AT cut the thickness shear mode $TS_1$ is always coupled to a flexure mode $F_1$. The mode $TS_1$ takes place in a plane XY' with a displacement of the particles of the material in the X direction of the quartz (electrical axis). The mode $F_1$ takes place in the same plane XY' and propagates along the X axis of the quartz.

Such coupling gains in importance to the extent that the ratio $a/b$ becomes smaller, $a$ being the lateral dimension of the quartz bar in the direction X and $b$ the thickness of the plate.

The influence of this coupling shows itself in particular on the frequency spectrum where when the ratio $a/b$ becomes small the frequency no longer depends uniquely on the thickness $b$ of the plate, but as well to an important extent on the lateral dimension $a$.

Thus, should one wish to utilize a pure thickness shear mode, to simplify the theoretical analysis and eventual manufacture in order that the resonance frequency should depend only from the thickness of the plate it is necessary that the ratio $a/b$ have a large value; in practice a ratio $a/b$ equal to or greater than 30 is used.

Also in the example of mass production (reference 3., hereinabove, pg. 322, FIG. 3) there is shown a filter for a frequency of 5.3 MHz which corresponds to a thickness of 0.31 mm and where the dimension along the X axis equals 0.46 inches,(11.7 mm) thus giving a ratio $a/b$ = 38.

2. An almost pure thickness shear vibration results in only an amplitude attenuation outside the energy trapping zone. Thus a considerable distance is necessary between the edge of the energy trapping zone (for example the edge of the electrode) and the edge of the quartz in order to avoid absorptions or reflexions which may lower the quality of the filter.

In practice this type of filter is used for frequencies higher than 3-4 MHz. Below this limit the plates become excessively large.

For frequencies lower than 1 MHz modes of vibrations other than thickness shear are utilized. For example the British Pat. no. 1,361,622 uses a width extension mode.

With this latter mode there may be obtained filters having reasonable dimensions for frequencies down to approximately 262 kHz. Such mode, however, is no longer utilizable for for frequencies above 1 MHz unless one utilizes harmonics which will probably result in an excessively great impedance. Another inconvenience of a longitudinal mode in quartz is its unfavourable thermal behavior compared to that of a thickness shear mode in the AT cut.

It will of course be realized that although the discussion thus far has been in consideration of the particular qualities of quartz for use in resonators, like principles may be applied to other materials particularly where other applications are sought, as for instance in the design of filters. Where other materials are employed it will be obvious that the various crystal structures employed will probably vary considerably from quartz and thus the method of cutting as well as the elastic constants to be applied will be different. Nevertheless the principles taught herein are equally valid, no matter what piezoelectric material might be employed for a particular filter operating in this fashion.

The invention thus seeks to realize a multiple resonator or filter obtained from a bar of piezoelectric material the contour of which has a rectangular form and shows at least two energy trapping zones. Such a bar or plate should have extremely reduced dimensions. Thus relative to known practical realizations it is possible to reduce by a factor of 10 the dimension in the X direction of a filter cut out of a quartz plate. The choice of dimensional ratios and of the orientation enables a very close control over the coupling of the different energy trapping zones as well as control over the thermal and electrical characteristics. Such principles are applicable to various piezoelectric materials.

Such filters will find use wherever the available space becomes critical in making the choice.

SUMMARY OF THE INVENTION

The invention accordingly provides a multiple resonator or filter in the form of a rectangular bar of piezoelectric material having at least two energy trapping zones and electrode means arranged to apply exciting energy to the bar, said bar being proportioned so as to vibrate in a mode in which thickness shear vibrations are strongly coupled to even harmonic flexure vibrations propagated for a width/thickness ratio less than 10.4, width being defined as the lateral dimension of the bar in the direction of the particle displacement due to the thickness shear vibrations, said energy trapping zones extending over the entire width of the bar.

A specific realization takes the form of a bar of Y cut quartz rotated approximately 35° and having its greatest dimension (length) arranged along the rotated optical (Z')axis, said bar being arranged and adapted to vibrate in a mode in which thickness shear vibrations are strongly coupled to even harmonic flexure vibrations, the width/thickness ratio where width is measured along the electric (X)axis having the following range of values:

1.1 to 1.9 for coupling with the 2nd flexure harmonic
2.2. to 3.6 for coupling with the 4th flexure harmonic
3.6 to 5.3 for coupling with the 6th flexure harmonic
5.1 to 6.8 for coupling with the 8th flexure harmonic
6.5 to 8.4 for coupling with the 10th flexure harmonic
8 to 10.4 for coupling with the 12th flexure harmonic and wherein at least two energy trapping zones are provided on the bar said zones extending over the entire width of the bar.

BRIEF DESCRIPTION OF THE DRAWINGS

FIG. 8 shows the spectrum of a resonator manufactured according to the present invention for a fundamental frequency of 4.19 MHz.

FIGS. 9 and 9a show plan and side views of a multiple resonator according to the present invention.

FIGS. 10 and 10a show respectively plan and side views of a second version of the invention.

FIGS. 11 and 11a show respectively plan and side views of still another form of the invention.

DETAILED DESCRIPTION

Figure 1:
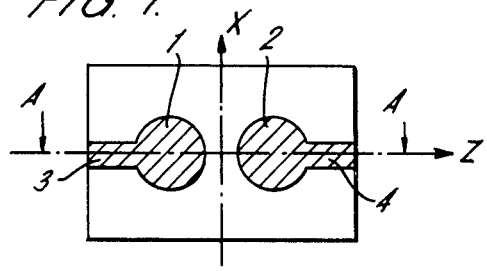
FIGS. 1 and 1a show respectively a plan and cross section A—A of a multiple resonator or filter made in accordance with the prior art techniques.
Figure 1A:
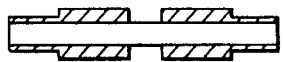

In FIG. 1 there is shown a multiple resonator or monolithic filter comprising two coupled resonators and made according to known techniques. The energy trapping zones 1 and 2 are formed by a metallic electrode deposit and may be coupled to current sources by means of leads 3 and 4 having a lesser thickness of metallization than that of the electrodes 1 and 2. The energy trapping zones occupy only a very small portion of the overall surface of the plate. To be noted is the considerable distance between the edge of the energy trapping zones and the edge of the piezoelectric plate in the X direction. The ratio of the lateral dimension of the plate in the X direction and of the thickness is generally of an order of 30 or more.

Figure 2:
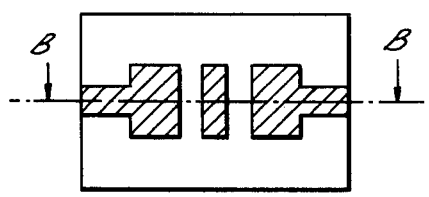
FIGS. 2 and 2a show a plan and cross section B—B view of another prior art form of multiple resonator.
Figure 2A:
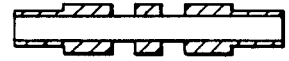

FIG. 2 shows another form of multiple resonator according to known techniques comprising three energy trapping zones. The central zone is not necessarily provided with an electrode. There also the lateral dimensions of the plate are great (30 times or more) relative to the thickness.

Figure 3A:
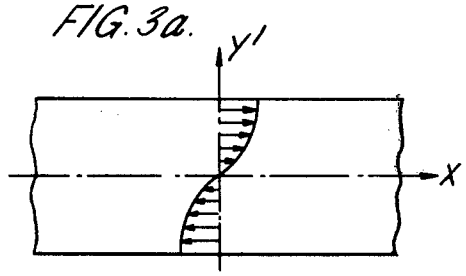
FIG. 3a shows particle displacement in a plate of material vibrating in pure thickness shear.
Figure 3B:
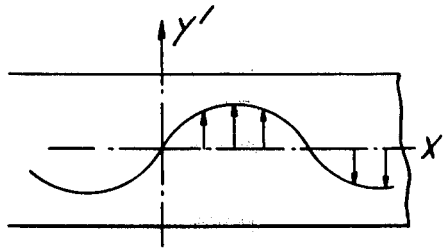
FIG. 3b shows the same plate of material having therein a flexure vibration.

FIG. 3a illustrates pure thickness shear in a bar of material with displacement of the material particles in the direction X as such will take place in a quartz bar or plate of the AT cut vibrating in the mode referred to as $TS_1$. The thickness shear wave is propagated in the direction Y' with reflexion on the free faces in order to form the standing wave. FIG. 3b shows in a same type of plate a flexure wave which propagates also in the X direction although in this case the particle displacement takes place in the direction Y'.

It will be realized that in a plate of finite dimensions vibrations in pure thickness shear cannot exist since angular momentum would not otherwise be conserved. To such vibration must be added the transversal movements (perpendicular to the plate) in order to assure compensation of the angular momentum and these movements are in the form of flexural vibrations. For an AT cut for which the thickness shear $TS_1$ takes place in the plane XY' the flexural modes $F_1$ coupled to the mode $TS_1$ take place in the same plane XY' and are propagated in the direction X.

Figure 4:
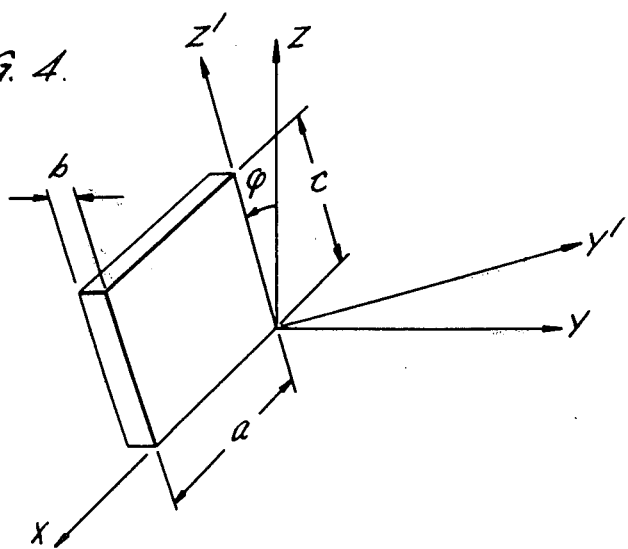
FIG. 4 shows the orientation of an AT cut quartz plate.

FIG. 4 shows an AT cut quartz for which the angle of rotation $\phi$ about the X axis is approximately 35°. With such a cut, for increased ratios $a/b$ there will be diminished coupling between modes $TS_1$ and $F_1$ and this is why, up to the present time, one has tended to use large plates wherein $a/b$ was equal to or greater than 30 in order to diminish the influence of such coupling. Thus the properties of the resonator or filter in such cases remain substantially independent from the dimension a. However, flexural modes which are propagated in the X direction are not attenuated outside the energy trapping zones and thus may provoke losses if the plate is held on its X faces and/or from parasitic reflexions if the X faces are free.

For a very small dimensional ratio $a/b$ for example $a/b = 3$ a very strong coupling will exist between the modes $TS_1$ and $F_1$. Such coupling will change the known properties of the usual type of AT resonators. For example frequency as well as the electrical and thermal behaviour depend from the dimension a and this may cause problems. For a given frequency it is necessary to control exactly the width a and the thickness b, note for example FIG. 5. On the other hand an advantage is obtained in view of the fact that the thermal behaviour may be influenced by the angle of the cut and the dimension a and this permits the obtaining of an inflection point at 60°. The slope at 25° of the frequency-temperature curves as well as the dynamic capacity of the resonator having a very small ratio $a/b$ depend in a parabolic and cyclic manner from this ratio, note particularly FIGS. 6 and 7.

Figure 5:
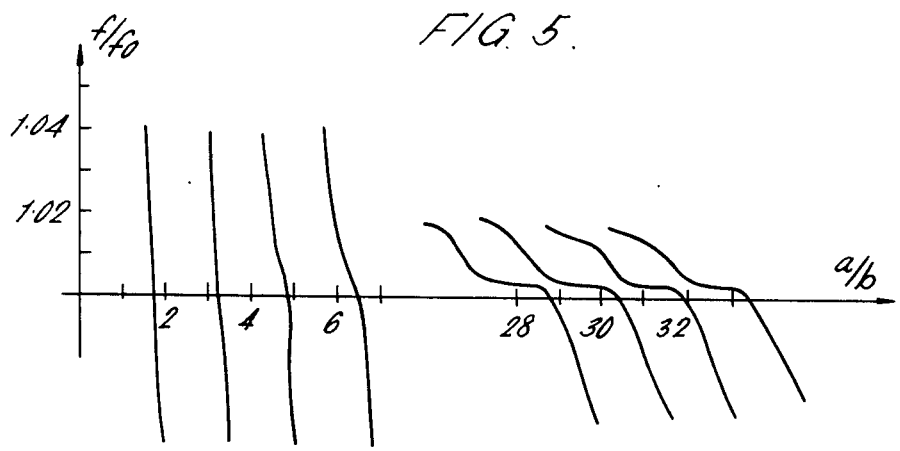
FIG. 5 shows the frequency spectrum of a quartz plate as a function of the dimensional ratio $a/b$.

Reverting for the moment to FIG. 5 it will be noted that the ordinate therein represents the normalized frequency $f/f_o$ where $f_o$ is the resonance frequency of an infinite plate and is given by $f^2 = C'_{66}/4b^2\rho$, $C'_{66}$ being the rotated elastic constant and $\rho$ the density of the quartz. A similar aspect however will obtain for all thin plates vibrating in thickness shear. There will be noted the region of large dimensional ratios $a/b = 30$ where steps or shelves may be said to exist, that is to say, where the frequency practically does not depend on the dimension a. This region where the influence of the coupling with the flexure mode is negligeable is utilized in multiple resonators or filters manufactured according to known techniques. In the present invention to the contrary there is used the region of small dimensional ratios $a/b$ for example 10.4 or less where the frequency is strongly dependent on the dimension a, this permitting the reduction up to a factor of 10 of the lateral dimension.

Figure 6:
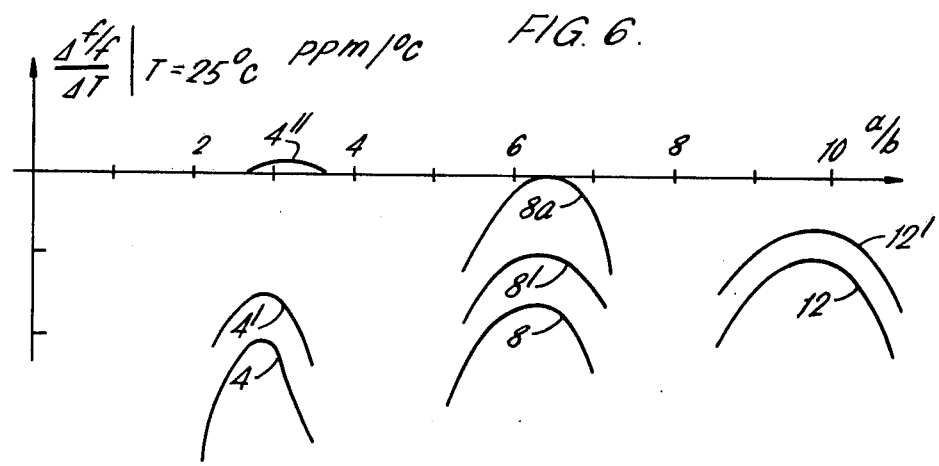
FIG. 6 shows the influence of the ratio $a/b$ on the thermal properties of a quartz resonator.
Figure 7:
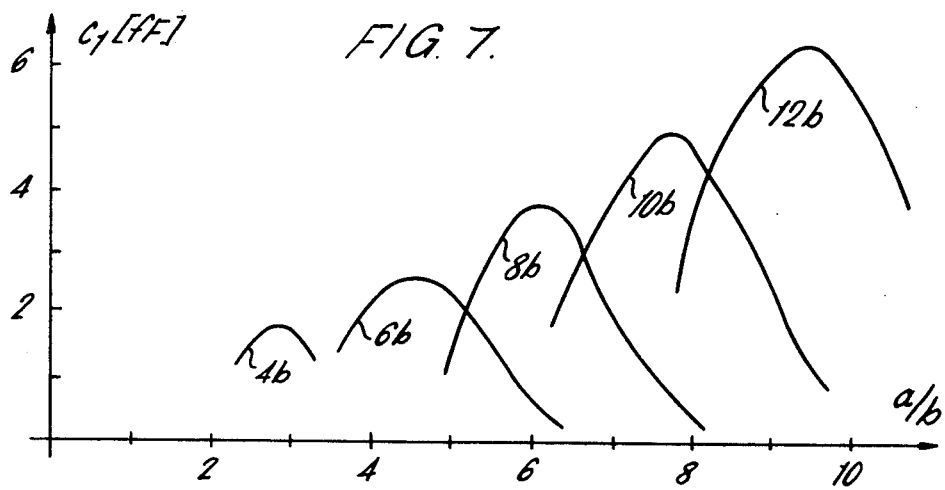
FIG. 7 shows the influence of the ratio $a/b$ on the dynamic capacity $C_1$.

The ordinate of FIG. 6 gives the slope at 25° of the frequency-temperature curves. Curves 4, 8 and 12 are calculated for an angle of 35°15′ and 8a for 34°36′. Curves 4′, 8′ and 12′ are measured for an angle of 35°15′ and 4″ for an angle of 34°48′.

Thus it will be seen that for these small dimensional ratios we no longer seek to obtain an attenuation of the mode of vibration in the direction X outside the energy trapping zone. On the contrary, we week constant amplitude of vibration along the X axis by giving the dimension along X of the energy trapping zone the same value as the dimension a of the plate. In other words the energy trapping zone extends over the entire width $a$ of the plate as will be appreciated from FIGS. 9 to 13.

As shown by measurements this coupled mode possesses an attenuation along the direction Z′ stronger than that given by the well-known formula valid for pure thickness twist $$e^{-2.94\sqrt{\Delta}(d/b)}$$

where $\Delta$ is the relative lowering of the frequency of the resonator with or without electrodes (energy trapping zone) and $d$ is the distance from the edge of the electrode. This strong attenuation enables limiting the dimension $c$ along the axis Z′ while maintaining a very high quality factor.

The energy trapping which is perfect, since there is no flexural mode being propagated in the direction Z′, permits also a very ragid fastening of the plate thereby minimizing or eliminating parasitic modes not submitted to energy trapping.

FIG. 8 shows the spectrum of an resonator having a single pair of electrodes. Purity of this spectrum is due to the following:

a. the perfect energy trapping permits a rigid fastening which limits or eliminates all parasitic modes,
b. the coupled modes $TS_1$ plus $F_1$ immediately above and below the fundamental mode are on the one hand separated in their frequency (see FIG. 5) and on the other hand have a very small dynamic capacity (see FIG. 7),
c. the dimension a being very small the resonances of modes which depend from this dimension have very high frequencies and are few in number.

In utilizing such a plate with several energy trapping zones separated from one another by a given distance, filters are obtained of an extremely small dimension and having extremely high spectral purity.

In FIGS. 9 and 9a there is shown a multiple resonator in which there are two energy trapping zones and wherein the lateral dimension is extremely limited.

FIGS. 10 and 10a show likewise a resonator according to this invention in which the two energy trapping zones are united by means of a common electrode, note particularly FIG. 10a.

FIGS. 11 and 11a show an execution according to this invention wherein 3 zones of energy trapping are provided.

Figure 12:
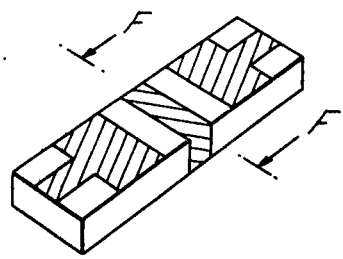
FIGS. 12 and 12a show a perspective and cross sectional view of still another form of the present invention.
Figure 12A:
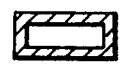
Figure 13:
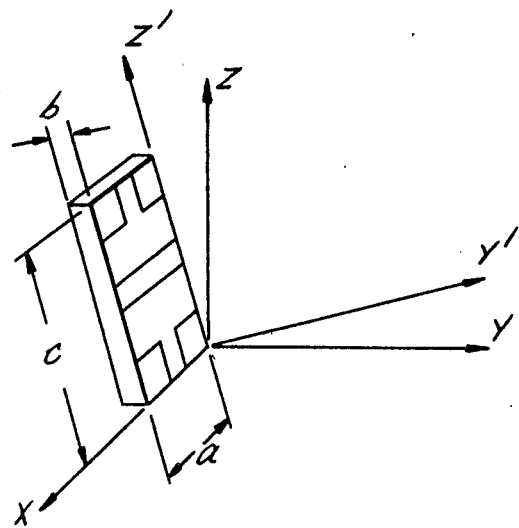
FIG. 13 shows the orientation of a multiple resonator manufactured from a plate of AT cut quartz according to the present invention.

FIG. 12 shows a multiple resonator according to this invention in which the energy trapping in the central zone is of a piezoelectric nature obtained by short circuiting the upper and lower electrodes by means of a metal layer applied to the sides. Such layer can have varying dimensions or be of different metal in order to vary the resistance and thus the short circuit current. Finally, FIG. 13 shows the orientation of a multiple resonator according to this invention wherein the resonator is cut from quartz according to the AT cut.

The band pass characteristics such as band width, band width attenuation, impedance characteristics ets., as desired for these resonators used as filters will be obtained through choice of the number of energy trapping zones, physical separation between the zones, length of each zone and the thickness of metallisation or the extra thickness of the resonator material at each zone.

What we claim is:

1. A multiple resonator or filter in the form of a rectangular bar of piezoelectric material having at least two energy trapping zones, and electrode means arranged to apply exciting energy to the bar, said bar being proportioned so as to vibrate in a mode in which thickness shear vibrations are strongly coupled to even harmonic flexure vibrations propagated for a width/thickness ratio less than 10.4, width being defined as the lateral dimension of the bar in the direction of particle displacement due to the thickness shear vibrations, said energy trapping zones extending over the entire width of the bar.

2. A multiple resonator or filter comprising a bar of Y cut quartz rotated approximately 35° and having its greatest dimension (length) arranged along the rotated optical (Z′)axis, said bar being arranged and adapted to vibrate in a mode in which thickness shear vibrations are strongly coupled to even harmonic flexure vibrations, the width/thickness ratio where width is measured along the electric (X)axis having the following range of values 1.1 to 1.9 for coupling with the 2nd flexure harmonic
2.2 to 3.6 for coupling with the 4th flexure harmonic
3.6 to 5.3 for coupling with the 6th flexure harmonic
5.1 to 6.8 for coupling with the 8th flexure harmonic
6.5 to 8.4 for coupling with the 10th flexure harmonic
8 to 10.4 for coupling with the 12th flexure harmonic
and wherein at least two energy trapping zones are provided on the bar said zones extending over the entire width of the bar.

3. A muliple resonator or filter as set forth in claim 1 wherein said energy trapping zones are obtained by metal deposits on the bar.

4. A multiple resonator or filter as set forth in claim 2 wherein said energy trapping zones are obtained by metal deposits on the bar.

5. A multiple resonator or filter as set forth in claim 1 wherein some of the energy trapping zones are obtained by chemical attack, ion milling, plasma etching, or the like, predetermined zones being provided with metal electrodes.

6. A multiple resonator or filter as set forth in claim 2 wherein some or all of the energy trapping zones are obtained by chemical attack, ion milling, plasma etching, or the like, predetermined zones being provided with metal electrodes.

7. A multiple resonator or filter as set forth in claim 1 wherein at least one energy trapping zone is obtained by means of a short circuited electrode extending completely around the bar.

8. A multiple resonator or filter as set forth in claim 2 wherein at least one energy trapping zone is obtained by means of a short circuited electrode extending completely around the bar.

9. A multiple resonator or filter as set forth in claim 7 wherein the short-circuited electrode is formed so as to exhibit a predetermined electrical resistance thereby to determine the short circuit current.

10. A multiple resonator or filter as set forth in claim 8 wherein the short-circuited electrode is formed so as to exhibit a predetermined electrical resistance thereby to determine the short circuit current.

* * * * *